(12) United States Patent
Baumgart

(10) Patent No.: US 6,346,821 B1
(45) Date of Patent: Feb. 12, 2002

(54) METHOD FOR NONDESTRUCTIVE MEASUREMENT OF MINORITY CARRIER DIFFUSION LENGTH AND MINORITY CARRIER LIFETIME IN SEMICONDUCTOR DEVICES

(75) Inventor: Helmut Baumgart, Glen Allen, VA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/266,039

(22) Filed: Mar. 11, 1999

Related U.S. Application Data

(60) Provisional application No. 60/079,716, filed on Mar. 27, 1998.

(51) Int. Cl.[7] .............................................. G01R 31/26
(52) U.S. Cl. ...................................... 324/766; 324/751
(58) Field of Search ................................ 324/753, 768, 324/769, 766, 719, 752, 765, 751

(56) References Cited

U.S. PATENT DOCUMENTS

| | | | | | |
|---|---|---|---|---|---|
| 3,674,995 A | * | 7/1972 | Kendall | ...................... | 700/207 |
| 3,676,715 A | * | 7/1972 | Brojdo | ...................... | 327/581 |
| 3,859,595 A | * | 1/1975 | Lang | .......................... | 324/766 |
| 4,122,383 A | * | 10/1978 | Roos | .......................... | 324/752 |
| 4,406,949 A | * | 9/1983 | Spohnheimer | .............. | 250/548 |
| 4,839,588 A | * | 6/1989 | Jantsch et al. | .............. | 324/766 |
| 4,912,052 A | * | 3/1990 | Miyoshi et al. | ............. | 324/751 |
| 4,968,932 A | * | 11/1990 | Baba et al. | ................. | 324/767 |
| 5,153,503 A | * | 10/1992 | Yahata | ....................... | 324/765 |
| 5,479,106 A | * | 12/1995 | Takahashi et al. | .......... | 324/753 |
| 5,723,981 A | * | 3/1998 | Hellemans et al. | ......... | 324/719 |
| 5,883,518 A | * | 3/1999 | Borden | ....................... | 324/752 |

* cited by examiner

Primary Examiner—Safet Metjahic
Assistant Examiner—Vincent Q. Nguyen
(74) Attorney, Agent, or Firm—Stanton C. Braden

(57) ABSTRACT

A method is provided for nondestructive measurement of minority carrier diffusion ($L_p$) length and accordingly minority carrier lifetime ($Ó_p$) in a semiconductor device. The method includes the steps of: reverse biasing a semiconductor device under test, scanning a focused beam of radiant energy along a length of the semiconductor device, detecting current induced in the DUT by the beam as it passes point-by-point along a length of the DUT, detecting current induced in the semiconductor device by the beam as it passes point-by-point along the scanned length of the semiconductor device to generate a signal waveform (Isignal), and determining from the Isignal waveform minority carrier diffusion length ($L_p$) and/or minority carrier lifetime ($Ó_p$) in the semiconductor device.

12 Claims, 5 Drawing Sheets

METHOD FOR NONDESTRUCTIVE MEASUREMENT OF MINORITY CARRIER DIFFUSION LENGTH AND MINORITY CARRIER LIFETIME IN SEMICONDUCTOR DEVICES

CROSS-REFERENCE TO RELATED APPLICATIONS

This application is related to and derived from Provisional Application Serial No. 60/079,716, filed on Mar. 27, 1998, in which the inventorship and assignee are the same as herein.

FIELD OF THE INVENTION

This invention relates to a method for measuring by means of an optical beam induced current (OBIC), or by an electron beam induced current (EBIC), minority carrier diffusion length and minority carrier lifetime in various semiconductor devices, such as lateral double diffused metal oxide semiconductors (LDMOS) which are intended for higher voltage (HV) applications, as well as other semiconductor devices including metal oxide semiconductor field effect transistors (MOSFET), and ultra-miniature dynamic random access memories (DRAM).

BACKGROUND OF THE INVENTION

It is well known that an induced current can be generated in a semiconductor having a p-n junction or Schottky barrier (metal-semiconductor rectifying contact) by shining a focused beam of radiation of above bandgap energy, either optical or electron beam, on the body of the semiconductor. Apparatus for generating such beams and for scanning them across a device under test (DUT) are commercially available. Where a DUT is small (e.g., smaller than a micron), a scanning electron microscope utilizing an electron beam and vacuum chamber is typically used to investigate the device. In the case of a large area device, such as a high-voltage HV LDMOS transistor (which typically is ten or more microns in length), it is convenient to use a laser beam shining through an optical microscope to illuminate and scan the device. Such laser-optical apparatus is also commercially available. But in either case, when a semiconductor with a p-n junction is illuminated by a radiant beam of appropriate wavelength and intensity, a small current is generated in the a semiconductor. In the case of an electron beam, current is generated by the "Compton effect". For a laser beam, current is due to the photo effect. Both of these effects are well known.

A problem prior to this invention was how to quantitatively measure in a nondestructive way the degradation of materials of a semiconductor device caused by process-induced defects, such as dislocations, oxidation induced stacking faults (OSFS), thermal and stress induced slip, misfit, point defect agglomeration and precipitation, bulk micro defects (BMDs), etc. Minority carrier lifetime is a good measure of the overall quality of semiconductor material, such as a wafer of silicon (Si). After a number of wafer processing steps (e.g., a hundred or more steps) and thermal cyclings, such as during annealing at above 900° C. or so, process-induced defects may be nucleated and generated in devices being fabricated on the wafer. When this happens minority carrier lifetime in the devices will show a degradation to a greater or less degree. The recombination properties of minority carriers determine the basic electronic properties of Si and silicon-on-insulator (SOI) materials and control the performance of a variety of Si and SOI devices.

It is thus desirable to be able to measure easily, accurately and in a nondestructive way the minority carrier recombination characteristics of such devices. It is highly important to be able to do so for the proper and rapid evaluation of new Si and SOI technologies, where novel composite material systems are used and which may have varying degrees of crystal lattice perfection and unknown defect content.

The present invention provides the ability for quick, accurate and nondestructive measurement of minority carrier diffusion length and minority carrier lifetime in semiconductor devices. Prior to the invention, so far as is known, no one previously utilized either an EBIC or OBIC scanning system for the measurement of minority carrier diffusion length and/or minority carrier lifetime in semiconductor devices.

SUMMARY OF THE INVENTION

The present invention is directed to a method for measurement of minority carrier diffusion length ($L_p$) and/or minority carrier lifetime ($\acute{O}_p$) in a semiconductor device such as a high-voltage transistor having a p-n junction between a p-type conductivity region and an n-type conductivity type region.

In one aspect the present invention is directed to a method for measurement of minority carrier diffusion ($L_p$) length and accordingly minority carrier lifetime ($\acute{O}_p$) in a semiconductor device. The method comprises the steps of reverse biasing the semiconductor device; scanning a focused beam of radiant energy along a length of the semiconductor device; detecting current induced in the semiconductor device by the beam as it passes point-by-point along the scanned length of the semiconductor device to generate a signal waveform (Isignal); and determining from the Isignal waveform minority carrier diffusion length ($L_p$) and/or minority carrier lifetime ($\acute{O}_p$) in the semiconductor device.

From another aspect the present invention is directed to a method for nondestructive measurement of minority carrier diffusion ($L_p$) length in a semiconductor device having a p-n junction between a p-type conductivity region and an n-type conductivity region. The method comprises the steps of reverse biasing with a voltage the semiconductor device; scanning a focused beam of radiant energy along a distance "x" of a length of the semiconductor device over the p-n junction and into one region thereof; detecting current induced in the semiconductor device by the beam as it passes point-by-point along the scanned length of the semiconductor device to generate a signal waveform (Isignal) as a function of distance "x"; and determining from the Isignal waveform minority carrier diffusion length ($L_p$), and/or minority carrier lifetime ($\acute{O}_p$) in the semiconductor device.

From still an other aspect the present invention is directed to a method for nondestructive measurement of minority carrier diffusion ($L_p$) length and/or minority carrier lifetime ($\acute{O}_p$) in a semiconductor device, such as a high-voltage transistor having a p-n junction between a p-type conductivity region and an n-type conductivity region. The method comprises the steps of reverse biasing with a voltage a semiconductor device; scanning a focused laser beam along a distance "x" of a length of the semiconductor device over the p-n junction and into one region of the semiconductor device; detecting optically beam induced current (OBIC) in the semicondcutor device as the beam passes in the "x" direction along the scanned length of the semiconductor device to generate a signal waveform (Isignal) as a function of distance "x"; and determining from the Isignal waveform minority carrier diffusion length $L_p$ and/or minority carrier lifetime $\acute{O}_p$ in the semiconductor device.

A better understanding of the invention together with a fuller appreciation of its many advantages will best be gained from a study of the following description and claims given in conjunction with the accompanying drawings.

DETAILED DESCRIPTION

Figure 1:
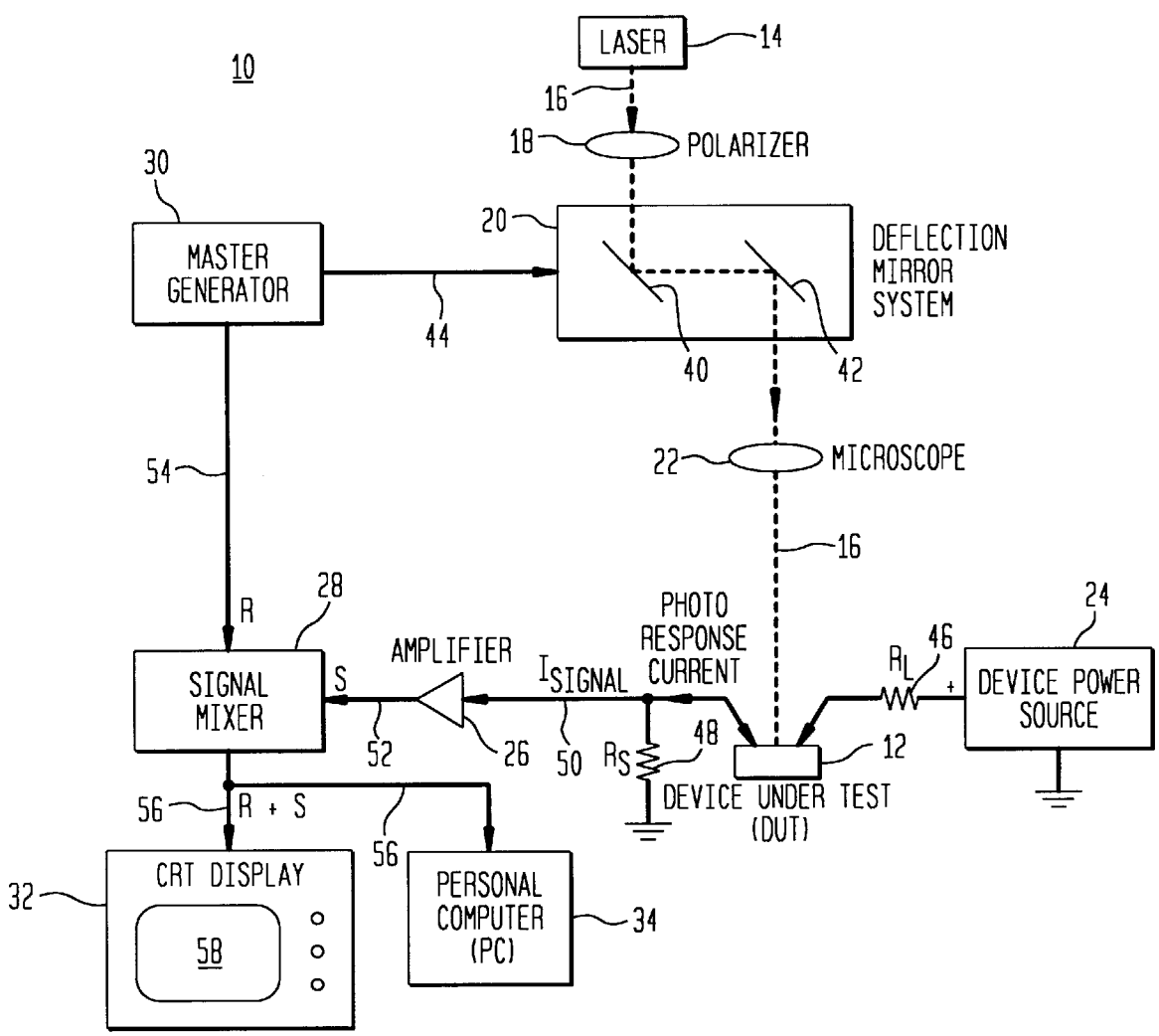
FIG. 1.is a schematic illustration partly in block diagram form of apparatus for scanning a semiconductor device under test (DUT) and for generating optical beam induced current in the DUT to determine a measurement of minority carrier diffusion length (Lp) in the DUT and thereby determine minority carrier lifetime ($\acute{O}_p$) in accordance with a method of the present invention.

Referring now to FIG. 1, there is shown an optical beam scanning apparatus 10 utilized to measure the minority carrier depletion length Lp of a semiconductor device under test (DUT) 12 in accordance with a method of the present invention. The apparatus 10 comprises a laser 14 which emits a beam 16, a polarizer 18, a deflection mirror system 20, a microscope 22 which focuses the beam 16 in a fine spot on the DUT 12, a device power source 24, a signal amplifier 26, a signal mixer 28, a raster generator 30, a cathode ray tube (CRT) display 32, and a personal computer (PC) 34. While individual elements of the apparatus 10 are well known in the art, they are utilized in accordance with the method of the present invention in a unique way to measure nondestructively the diffusion length (Lp) of minority carriers in the DUT 12, as will be explained in detail hereinafter. It is to be understood that the invention is not limited solely to use of optical beams but applies equally well to use of electron beams.

The laser 14 emits a beam 16 of light with a wavelength, for example, of 633 nanometers (nm) and of suitable intensity (e.g., several watts). The beam 16 passes through a polarizer 18 and into the deflection mirror system 20. The mirror system 20 includes a plurality of moveable mirrors 40 and 42 which are driven back and forth by electrical signals received via a lead 44 from the raster generator 30. Mechanical movement of the mirrors 40 and 42 deflects the beam 16 back-and-forth and side-to-side in synchronism with electrical signals from the generator 30 as is well known to synchronize it with the CRT display. The beam 16 passes from the deflection mirror system 20 and into the microscope 22 which focuses the beam 16 into a fine spot (e.g., about a micron in diameter) onto a surface of the DUT 12. This results in optical beam induced current (OBIC) in the DUT 12. The beam 16, as it is being deflected by the deflection system 20, thus scans line by line along a length of the DUT 12.

During scanning by the beam 16, the DUT 12 is reverse biased by a positive voltage (+V) from the device power source 24, (a negative side of which is grounded), and a load resistor ($R_L$) 46. A photo-response current passes from the DUT 12 through a sensing resistor ($R_S$) 48 to ground. A signal, termed "Isignal" is applied from the sensing resistor 48 via a lead 50 to an input of the amplifier 26, an output of which is applied via a lead 52 to one input (S) of the signal mixer 28. A raster signal is applied to another input (R) of the signal mixer 28 via a lead 54 from the raster generator 30. Dual signals (R+S) from the signal mixer 28 are applied via a common connection 56 to an input of the CRT display 32 where the signals are displayed on a screen 58 as a waveform (to be discussed hereinafter) having the usual x and y coordinates. The dual R+S signals on the common connection 56 are also applied to the personal computer 32 where they are processed and the minority carrier diffusion length $L_p$ and minority carrier lifetime ($\acute{O}_p$) are obtained, as will be explained hereinafter.

Figure 2:
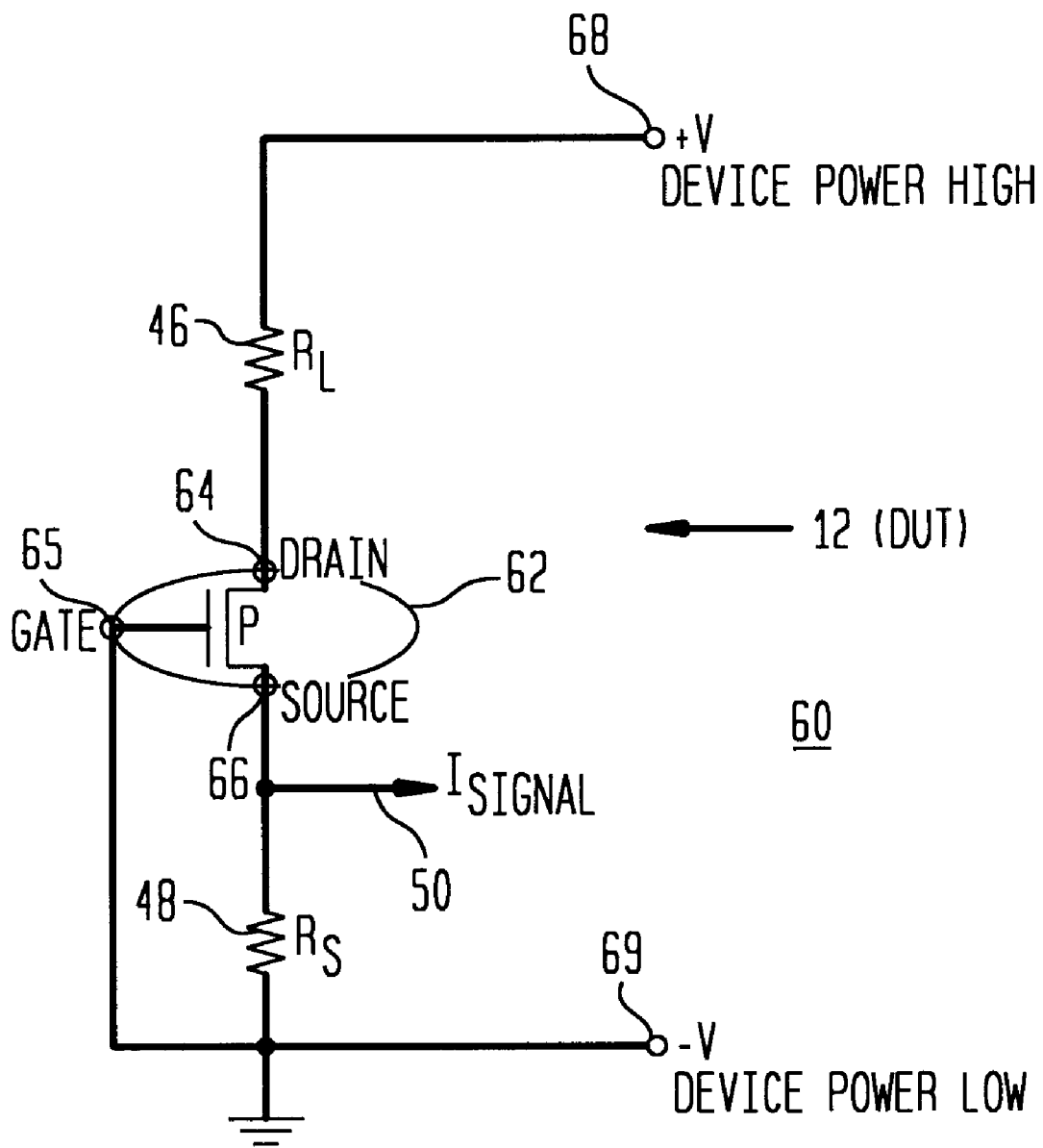
FIG. 2 is a circuit diagram showing how a semiconductor DUT, such as shown in FIG. 1, is reverse biased during measurement of diffusion length Lp.

Referring now to FIG. 2, there is shown a schematic circuit diagram 60 showing electrical connections to the DUT 12 of FIG. 1. As seen in the diagram 60, the DUT 12 is, by way of example, an LDMOS type transistor 62 having a drain 64, a gate 65, and a source 66. It is to be understood, however, that the DUT 12 may be a semiconductor other than the transistor 62 shown here. The transistor 62, while being scanned by the beam 16, is reverse-biased with its drain 64 connected via the load resistor ($R_L$) 46 (see FIG. 1) to a positive terminal 68 (+V) of the power supply 24 (not shown here but shown in FIG. 1). A negative side of the device power supply 24 (not shown here but shown in FIG. 1) is connected to a negative terminal 69 (–V) which is shown as ground. The gate 65 of the transistor 62 is connected directly to ground while the source 66 is connected via the sensing resistor ($R_S$) 48 to ground. A voltage across the sensing resistor 48 is proportional to OBIC current as the DUT 12 is scanned by the beam 16, as was previously explained. This voltage is applied to the lead 50 (also see FIG. 1) and is termed "Isignal" The output voltage +V of the supply 24 can be varied over a wide range until the onset of avalanche breakdown of the device. By way of illustration, the resistor ($R_L$) 46 may have a value of 100 K ohms, the resistor ($R_S$) 48 a value of 10 K ohms, and the resistance in reverse bias across the drain 64 and the source 66 of the transistor 62 may be approximately 100M ohms.

Figure 3:
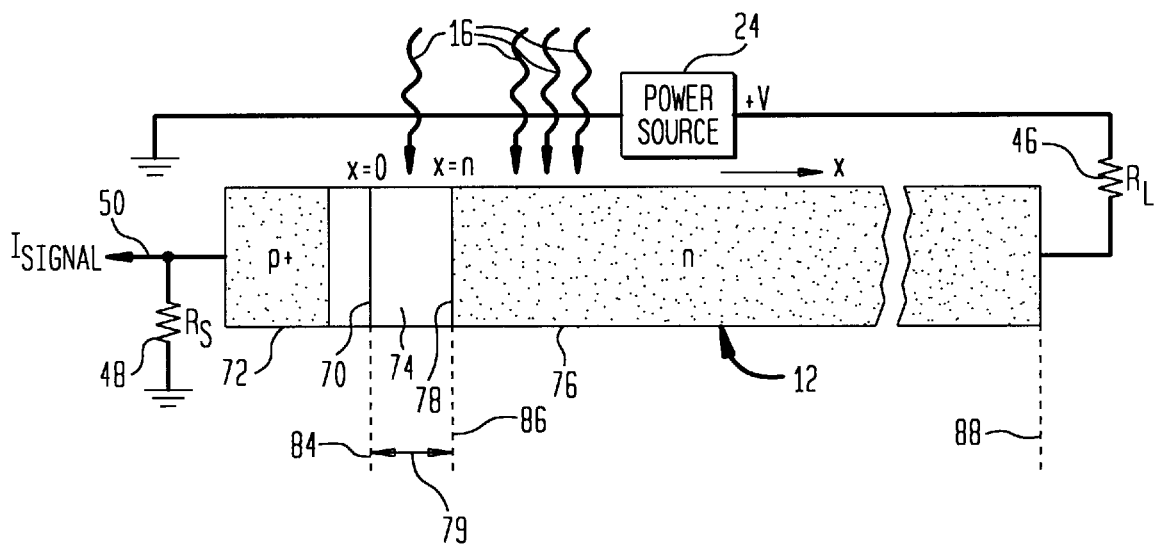
FIG. 3 is a greatly enlarged schematic view showing the DUT;of FIG. 1.

Referring now to FIG. 3, there is shown greatly enlarged and in highly schematic and simplified form of a lateral high voltage diode, the DUT 12. Distance along the length of the DUT 12 is indicated at "x"; various locations of the light beam 16 as it is scanned to the right along the DUT 12 are as indicated, and a p-n junction 70 of the DUT 12 is indicated at x=0. A first shaded area of the DUT 12 represents a p+type conductivity body region 72, an unshaded area on both sides of the p-n junction 70 represents an unsymmetrical space charge region 74, and a second shaded area represents the remainder of the n-type conductivity drift region 76. Electrical connections to the DUT 12 are as indicated (see also FIG. 2).

The unshaded area (space charge region 74) represents the depletion region adjacent to the p-n junction 70 of the DUT 12 where all of the laser induced photo-generated electron-hole pairs are separated and collected by the high local field applied by the reverse bias voltage, giving rise to the OBIC photocurrent. The second shaded area indicates a neutral n-type drift region 76 outside of the depletion region (space charge region 74) where the photo-generated carriers are not collected any more and no OBIC photocurrent is measured.

Within the space charge region 74 essentially all photo-generated electron-hole pairs are collected and yield a maximum signal which is applied to the lead 50 as "Isignal". As the scanning laser beam 16 passes across an outer edge 78 of a depletion width, indicated at 79, farther into the n-type drift region 76, the collected OBIC (and Isignal) begins to decay. The actual depletion width, bounded by the edge 78, is dependent on the voltage +V of the power source 24.

It is known that the minority carrier current density ($J_p$) in a semiconductor as a function of distance (x) for the case of a reversed biased p-n junction of the semiconductor can be expressed by the following equation:

$$\left( J_p(x) = -\frac{q}{L_p} D_p p_n e^{\frac{x_n - x}{L_p}} \right) \quad \text{Eq. 1}$$

where $J_p(x)$ is minority carrier current density,
q is the elementary electronic charge,
$L_p$ is the diffusion length, for minority hole carriers,
$D_p$ is the diffusion constant for holes,
$p_n$ is the equilibrium minority carrier concentration of holes in n-type material, and
where $x_n$ is as shown at 78 in FIG. 3 and x is the measured distance to the right beyond the edge 78 of the depletion width 79.

It can be shown by a mathematical derivation from Eq. 1 that an OBIC signal measured as Isignal (FIGS. 2 and 3) is proportional to the exponent of $$\frac{(x_n - x)}{L_p} \quad \text{or:} \quad Isignal \approx e^{(x_n - x)/L_p} \quad \text{Eq. 2}$$

or;

$$Isignal \approx e^{(x_n - x)/L_p} \quad \text{Eq. 2}$$

It can also be shown by a further mathematical derivation using the Einstein relationship that minority carrier lifetime ($\acute{O}_p$) can be expressed as:

$$\acute{O}_p = L_p^2 / (\mu_p kt/q) \quad \text{Eq. 3}$$

where kt/q at 300° K=2.586×10$^{-2}$ volts and $\mu_p$ is the mobility of holes. A closely similar equation defines the lifetime of electrons.

As was mentioned above (see Eq. 2), the OBIC photocurrent (and Isignal) beyond the edge 78 of the depletion width 79 in the n-type drift region 76 varies proportionally (or nearly so) to exponent (xn−x)/Lp. In other words, the exponential decay of the OBIC photocurrent (and Isignal) in the n-type drift region 76 within a certain number of diffusion lengths beyond the edge 78 of the depletion width is proportional to the minority carrier diffusion length Lp and consequently is a measure of the Lp of the semiconductor material from which the DUT 12 is built. This will be explained in greater detail hereinafter.

Figure 4:
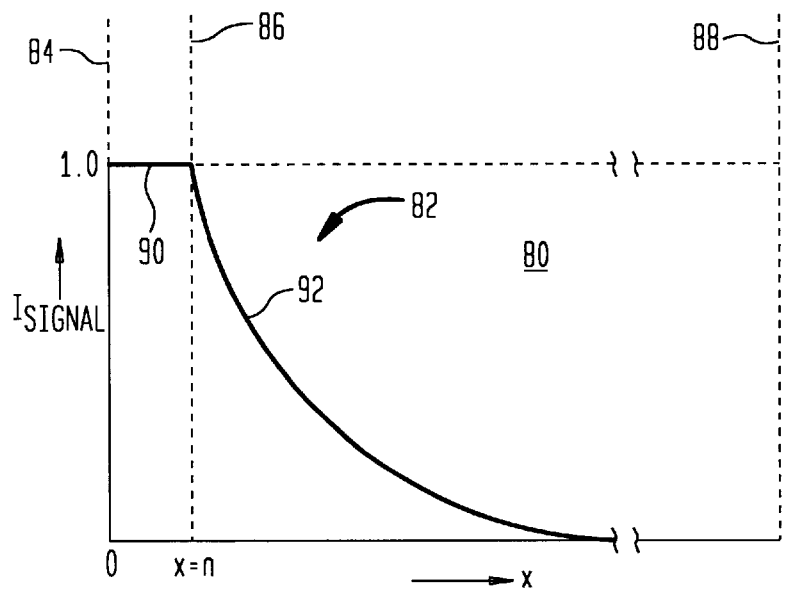
FIG. 4 is a somewhat idealized graph of measured optical beam induced current (OBIC) versus distance in an "x" direction along a length of the DUT of FIG. 3, and shows a waveform of a signal (Isignal) obtained for a given supply voltage V as the optical beam scans in the "x" direction along the length of the DUT.

Referring now to FIG. 4, there is shown a graph 80 of a somewhat idealized waveform 82 of Isignal. The horizontal axis of the graph 80 represents distance in the x direction along the DUT 12 (FIG. 3). The vertical axis of the graph 80 represents the magnitude of Isignal with a normalized level of "1.0" representing the maximum measured value. A first vertical dashed line 84 of FIG. 4 and FIG. 3 designates the position of the p-n junction 70 at x=0. A second vertical dashed line 86 of FIG. 4 and FIG. 3 designates the position of the edge 78 of the depletion width 79 at $x_n$, and a third vertical dashed line 88 of FIG. 4 and FIG. 3 represents the right end of the n-type drift region 76 of the DUT 12.

The waveform 82 has a first, generally horizontal portion 90, representing substantially constant OBIC (and Isignal) at the level 1.0 generated in the space charge region from x=0 to x=n. The waveform 82 then has a generally curved portion 92 beginning at x=n and decaying approximately exponentially from the level of 1.0 to 0 within a certain number of diffusion lengths as the beam 16 scans farther and farther along the n-type drift region 76. Isignal falls to zero (0) well before the right end of the n-type drift region 76 is reached. The waveform 82, which represents Isignal, is applied to the personal computer 34 (FIG. 1) which thereupon automatically computes from the measured values minority carrier diffusion length Lp and minority carrier lifetime ($\acute{O}_p$) Computer programs for such computation are easily written by those skilled in the art.

Figure 5:
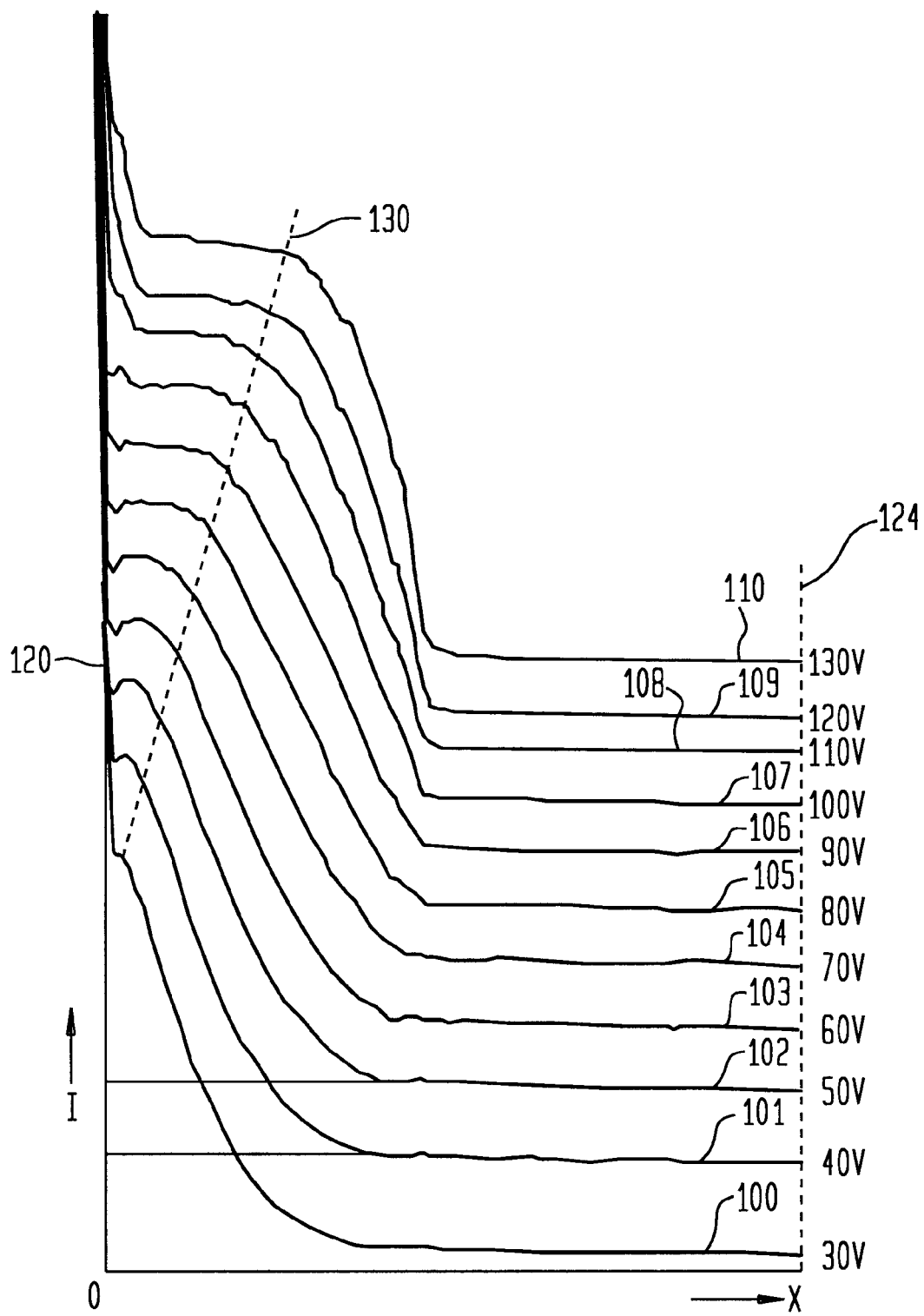
FIG. 5 shows actual Isignal waveforms for various supply voltages V, the waveforms being those projected on a CRT display unit of FIG. 1.

Referring now to FIG. 5, there are shown a number of oscilloscope traces from the screen 58 of the CRT display unit 32 (FIG. 1) of Isignal waveforms 100, 101, 102, 103, 104, 105, 106, 107, 108, 109 and 110 for respective supply voltages 30, 40, 50, 60, 70, 80, 90, 100, 110, 120, and 130 volts as indicated. The horizontal axis of the waveforms 100- 110 represents distance x as the beam 16 is scanned in time along the length of the DUT 12 (FIG. 3), and the vertical axis represents the level (normalized) of Isignal (FIG. 4). The waveform 101 has been manually displaced a small amount vertically above the waveform 100 in order not to confuse one waveform with the other. And the remaining waveforms 102–110 are each similarly displaced one from the other for the same reason.

A vertical line 120 shows the beginning of each waveform 100–110 at x=0 (the P-n junction 70 of the DUT 12) as it is being scanned by the beam 16 (see also FIGS. 3 and 4). A dashed vertical line 124 indicates that the end of the DUT 12 has been reached (see the dashed vertical line 88 between FIGS. 3 and 4). Each waveform 100–110 has a generally horizontal portion, akin to the portion 90 in FIG. 4, and then a generally exponentially decaying portion, akin to the portion 92 in FIG. 4, which drops to zero (0) as the beam 16 scans farther and farther along the n-type drift region 76 of the DUT 12 (FIGS. 3 and 4).

An upwardly slanting dashed line 130 intersects each of the waveforms 100–110 at a point where the respective waveform begins to change from being generally horizontal (see the portion 90 of the waveform 82 of FIG. 4) to decreasing generally exponentially (see the portion 92 of the waveform 82 of FIG. 4). This dashed line 130 indicates that the width of the depletion region bounded by the edge 78 (FIG. 3) increases as the supply voltage V is increased from 30 V to 130 V as shown here. All of the waveforms 100–110 decay to zero (0) before the end (indicated by the vertical dashed line 124) of the DUT 12 is reached.

Figure 6:
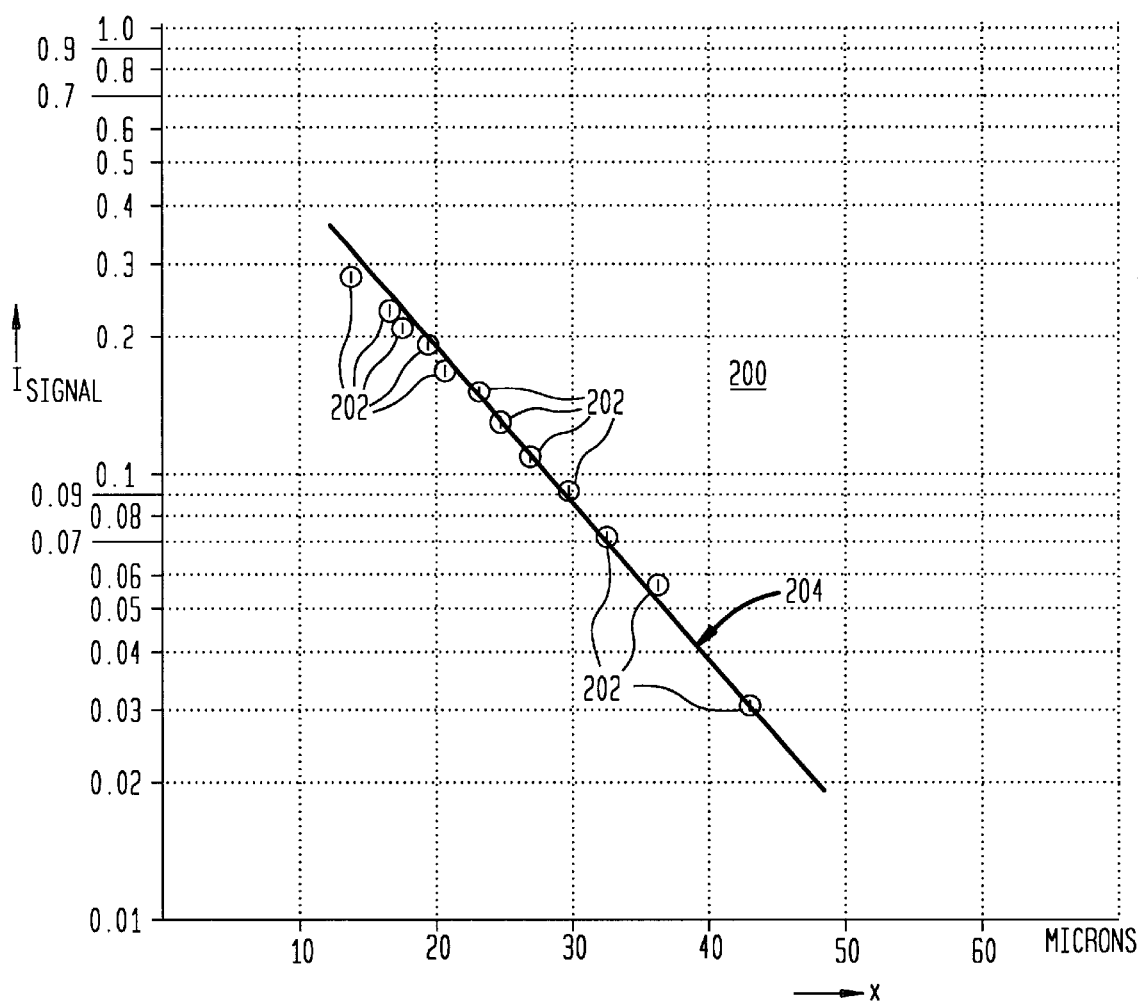
FIG. 6 is a semi-logarithmic graph of measured values of Isignal versus distances along the DUT for a given voltage V.

Referring now to FIG. 6, there is shown a semi-logarithmic graph 200 of actual measurements of respective values of Isignal versus distances in the "x" direction along the DUT 12 for a reverse bias voltage of 20V. The vertical axis of the graph 200 shows on a semi-logarithmic scale values of Isignal below a normalized value of "1.0", and the horizontal axis shows linear values of distance "x" measured in microns. The respective measurements of Isignal versus distance are indicated at points 202 which, as plotted in the semi-logarithmic graph 200, lie along a generally straight line 204. It should be understood that the straight line 204 shown here is equivalent to (via mathematical transformation) the generally exponential portion 92 of the waveform 82 of FIG. 4. As was mentioned previously, values of $L_p$ and $Ó_p$ are readily calculated from the data of graph 200. Using the Equations 2 and 3 for the particular set of measurement points 202 shown here, a value of 12.66 microns is obtained for $L_p$, and a value of 137.7 nanoseconds is obtained for $Ó_p$.

The above description is intended in illustration and not in limitation of the invention. Various changes in the apparatus described and in the method of the invention as set forth may occur to those skilled in the art, and these changes may be made without departing from the spirit or scope of the invention as set forth in the accompanying claims. In particular, the invention is not limited solely to application with the transistor illustrated in FIGS. 2 and 3, but is applicable to other semiconductor devices. Nor is the invention limited solely to use with OBIC apparatus but includes any EBIC configuration in a scanning electron microscope [SEM].

What is claimed is:

1. A method for measurement of minority carrier diffusion ($L_p$) length and accordingly minority carrier lifetime ($Ó_p$) in a semiconductor device comprising the steps of:
   reverse biasing the semiconductor device;
   scanning a focused beam of radiant energy along a length of the semiconductor device;
   detecting current induced in the semiconductor device by the beam as it passes point-by-point along the scanned length of the semiconductor device to generate a signal waveform (Isignal); and
   determining from the Isignal waveform minority carrier diffusion length ($L_p$) and/or minority carrier lifetime ( $Ó_p$) in the semiconductor device.

2. The method of claim 1 wherein the semiconductor device is a transistor such as a high voltage transistor having a length greater than a few diffusion lengths, and the bias voltage is between a few volts and the onset of avalanche breakdown of the device.

3. A method for nondestructive measurement of minority carrier diffusion ($L_p$) length in a semiconductor device having a p-n junction between a p-type conductivity region and an n-type conductivity region comprising the steps of:
   reverse biasing with a voltage the semiconductor device;
   scanning a focused beam of radiant energy along a distance "x" of a length of the semiconductor device over the p-n junction and into one region thereof;
   detecting current induced in the semiconductor device by the beam as it passes point-by-point along the scanned length of the semiconductor device to generate a signal waveform (Isignal) as a function of distance "x"; and
   determining from the Isignal waveform minority carrier diffusion length ($L_p$), and/or minority carrier lifetime ( $Ó_p$) in the semiconductor device.

4. The method of claim 3 wherein the diffusion length $L_p$ is determined by computer calculation from measured values of Isignal and distance "x" beyond a depletion width within which Isignal is generally constant at a maximum value and beyond which it decays generally exponentially.

5. The method of claim 3 wherein the Isignal waveform decays generally exponentially beyond a depletion width adjacent the p-n junction, and the diffusion length $L_p$ is proportional to exponent $[(x_n-x)/L_p]$ where "$x_n$" is the location of the p-n junction, and "x" is distance beyond the depletion width and into the one region.

6. The method of claim 5 wherein the diffusion length is computer calculated in accordance with the Equation:

$$Isignal \sim e[(x_n-x)/L_p]\ Isignal \approx e^{(x_n-x)/L_p}.$$

7. The method of claim 5 wherein the minority carrier lifetime $Ó_p$ is computer calculated in accordance with the Equation:

$$Ó_p = L_p^2/(\mu_p kt/q)$$

where kt/q at 300° K=2.586×10$^{-2}$ volts and $\mu_p$ is the carrier mobility of holes in silicon.

8. A method for nondestructive measurement of minority carrier diffusion ($L_p$) length and/or minority carrier lifetime ($Ó_p$) in a semiconductor device, such as a high-voltage transistor or high voltage diode having a p-n junction between a p-type conductivity region and an n-type conductivity region, the method comprising the steps of:
   reverse biasing with a voltage a semiconductor device;
   scanning a focused laser beam along a distance "x" of a length of the semiconductor device over the p-n junction and into one region of the semiconductor device;
   detecting optically beam induced current (OBIC) in the semiconductor device as the beam passes in the "x" direction along the scanned length of the semiconductor device to generate a signal waveform (Isignal) as a function of distance "x"; and
   determining from the Isignal waveform minority carrier diffusion length $L_p$ and/or minority carrier lifetime $Ó_p$ in the semiconductor device.

9. The method of claim 8 wherein the reverse bias voltage is between a few volts and the onset of avalanche breakdown of the device, and the length in the "x" direction of the semiconductor device is greater than a few diffusion lengths.

10. The method of claim 8 wherein the values of $L_p$ and $Ó_p$ are determined by computer calculations from a measured Isignal waveform for a particular bias voltage.

11. The method of claim 8 wherein the bias voltage is between a few volts and the onset of avalanche breakdown of the device.

12. A method of profiling minority carrier diffusion length (Lp) and/or minority carrier lifetime ($Ó_p$) in a semiconductor device having a p-n junction, comprising the steps of:
   reverse biasing with a voltage having a first value a semiconductor device under test (DUT);
   scanning a focused beam of radiant energy along a distance "x" of a length of the DUT over the p-n junction and farther into a drift region of the semiconductor;
   measuring beam induced current in the DUT to generate a signal waveform (Isignal) as a function of distance "x";
   repeating the above steps with at least one successive value of reverse bias voltage higher in value than the first value;
   determining from the successive Isignal waveforms related values of Lp and/or $Ó_p$; and
   using the values of Lp and/or $Ó_p$ to evaluate the quality and any process-induced degradation of the DUT.

* * * * *